(12) United States Patent
Wu et al.

(10) Patent No.: US 12,237,264 B2
(45) Date of Patent: *Feb. 25, 2025

(54) FUSIBLE STRUCTURES

(71) Applicant: TAIWAN SEMICONDUCTOR MANUFACTURING COMPANY, LTD., Hsinchu (TW)

(72) Inventors: Shao-Ting Wu, Hsinchu (TW); Meng-Sheng Chang, Hsinchu (TW); Shao-Yu Chou, Hsinchu (TW); Chung-I Huang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/322,481

(22) Filed: May 23, 2023

(65) Prior Publication Data

US 2023/0298995 A1    Sep. 21, 2023

Related U.S. Application Data

(63) Continuation of application No. 17/229,345, filed on Apr. 13, 2021, now Pat. No. 11,658,114.

(Continued)

(51) Int. Cl.
*H01L 23/525* (2006.01)
*H10B 20/25* (2023.01)
*H01L 21/3213* (2006.01)

(52) U.S. Cl.
CPC ......... *H01L 23/5256* (2013.01); *H10B 20/25* (2023.02); *H01L 21/32139* (2013.01)

(58) Field of Classification Search
CPC .......... H01L 23/5256; H01L 21/32139; H10B 20/20

(Continued)

(56) References Cited

U.S. PATENT DOCUMENTS 7,260,442 B2    8/2007    Hwang et al.
9,256,709 B2    2/2016    Yu et al.

(Continued)

FOREIGN PATENT DOCUMENTS

KR    20160030437    3/2016
TW    201214654    4/2012

OTHER PUBLICATIONS

Office Action dated Jun. 2, 2022 from corresponding application No. TW 1120546020 (pp. 1-6).

(Continued)

*Primary Examiner* — Quoc D Hoang
(74) *Attorney, Agent, or Firm* — Hauptman Ham, LLP

(57) ABSTRACT

A fusible structure includes: a metal line in a first metal layer extending along a first direction; and a first dummy structure disposed proximal to the metal line relative to a second direction, the second direction being perpendicular to the first direction, the first dummy structure being in a second metal layer. Relative to the first direction, the metal line includes first, second and third portions, the second portion being between the first portion and third portion. Relative to a third direction that is perpendicular to the first direction and the second direction, the first portion has a first thickness and the second portion has a second thickness, the first thickness being greater than the second thickness.

20 Claims, 11 Drawing Sheets

Related U.S. Application Data

(60) Provisional application No. 63/092,914, filed on Oct. 16, 2020.

(58) Field of Classification Search
USPC .......................................................... 257/529
See application file for complete search history.

(56) References Cited

U.S. PATENT DOCUMENTS

| | | |
|---|---|---|
| 11,658,114 B2 * | 5/2023 | Wu .................... H01L 23/5256 257/529 |
| 2008/0217735 A1 | 9/2008 | Chen et al. |
| 2008/0308900 A1 | 12/2008 | Kim et al. |
| 2009/0051002 A1 | 2/2009 | Booth, Jr. et al. |
| 2011/0001210 A1 | 1/2011 | Jeon |
| 2011/0024873 A1 | 2/2011 | Lee |
| 2014/0040838 A1 | 2/2014 | Liu et al. |
| 2015/0067620 A1 | 3/2015 | Wu et al. |
| 2015/0102458 A1 | 4/2015 | Choi et al. |
| 2015/0278429 A1 | 10/2015 | Chang |

OTHER PUBLICATIONS

Office Action dated Jun. 30, 2022 from corresponding application No. KR 20-2021-0076175 (pp. 1-4).

\* cited by examiner

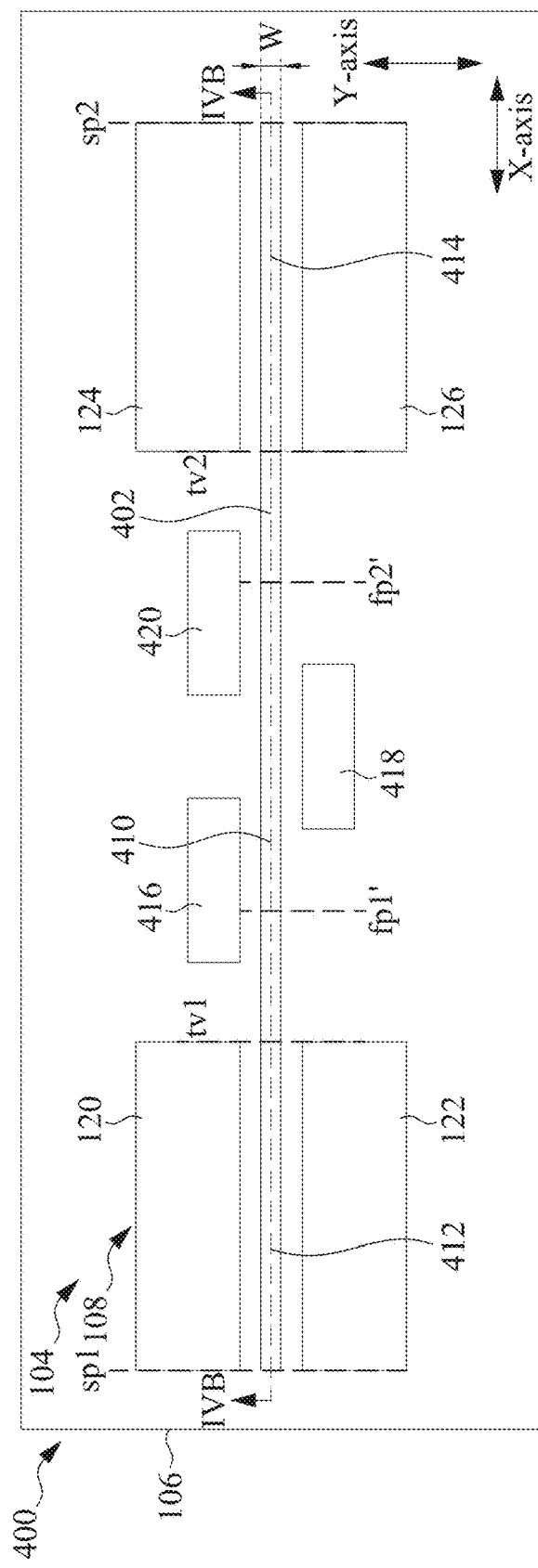
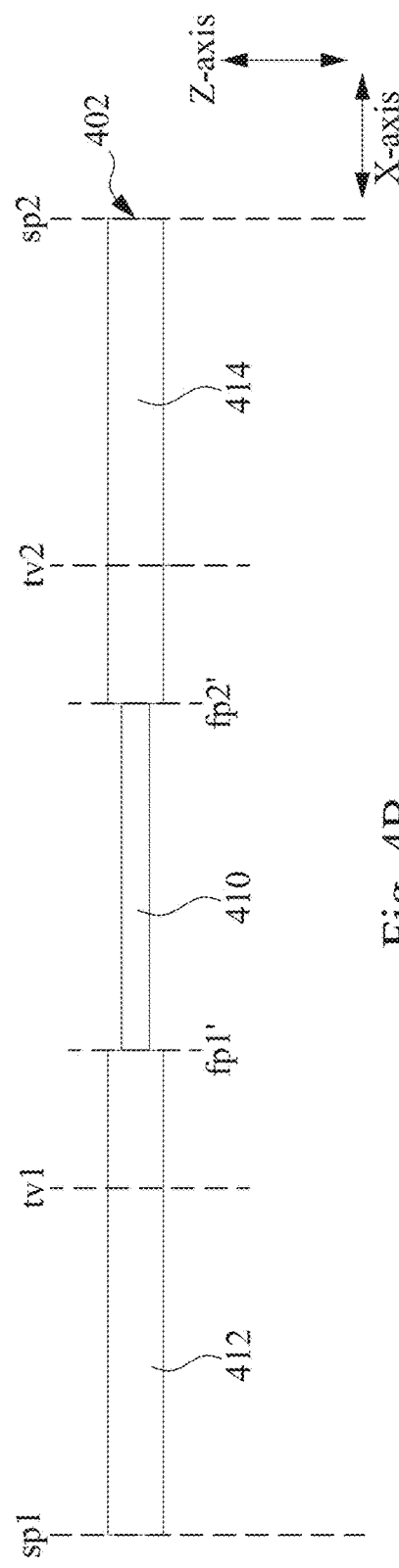
Fig. 4A
Fig. 4B

FUSIBLE STRUCTURES

PRIORITY CLAIM

The present application is a continuation of U.S. patent application Ser. No. 17/229,345, filed Apr. 13, 2021, now U.S. Pat. No. 11,658,114, issued May 23, 2023, which claims the priority of U.S. Provisional Application No. 63/092,914, filed Oct. 16, 202, each of which is incorporated herein by reference in its entirety.

BACKGROUND

The semiconductor integrated circuit (IC) industry has produced a wide variety of devices to address issues in a number of different areas. Some of these devices, such as fusible structures, are configured for a variety of uses including the storage of data. As fusible structures become smaller and more complex, the performance of these devices has become a concern in the industry.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 4A is a component diagram of a fusible structure, in accordance with some embodiments.

FIG. 4B is a component diagram that illustrates a cross-sectional view of the metal line taken along a midline of the metal line in a first direction, in accordance with some embodiments.

DETAILED DESCRIPTION

Figure 1A:
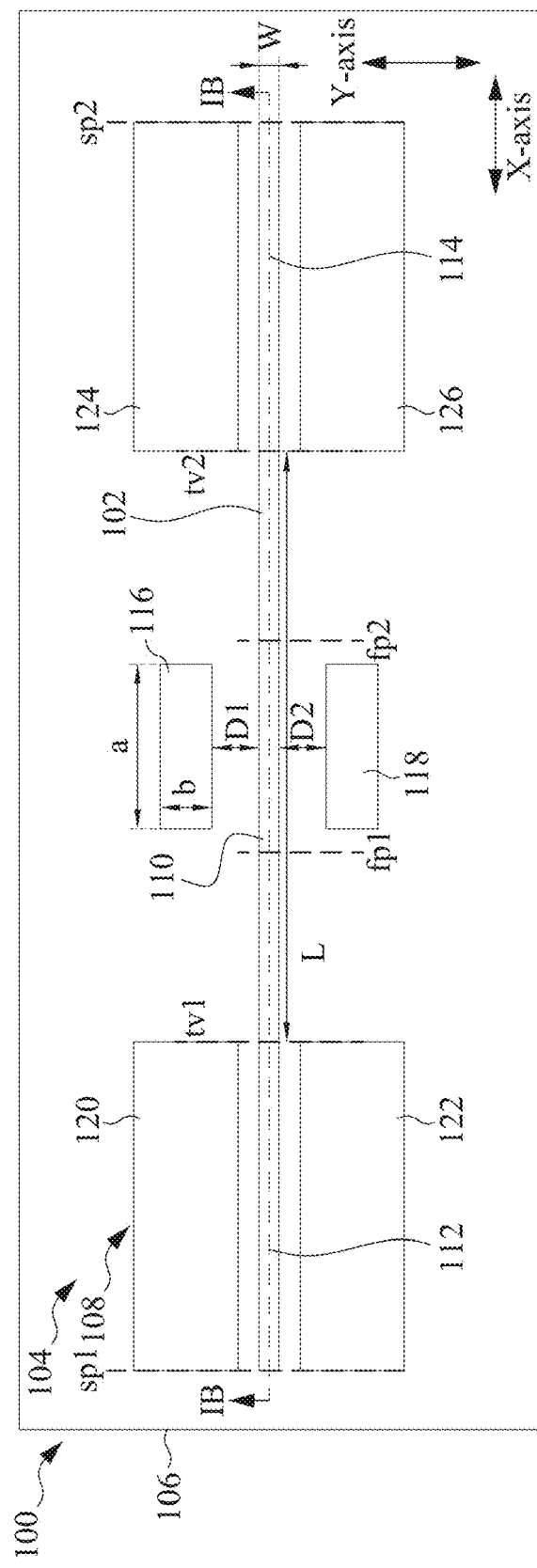
FIG. 1A is a component diagram of a fusible structure, in accordance with some embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments include fusible structures and corresponding methods of manufacturing the same. In some embodiments, a fusible structure includes a metal line with different portions having different thicknesses. Thinner portions of the metal line are designed to be destructively altered at lower voltages, relative to previously known technology, whereas thicker portions of the metal line are designed to be destructively altered at lower voltages. Furthermore, one or more dummy structures are disposed proximal to the thinner portions of the metal line. In some embodiments, dummy structures are placed with sufficient proximity to protect against metal sputtering when the metal line is destructively altered.

FIG. 1A is a top view of a fusible structure 100, in accordance with some embodiments.

In some embodiments, fusible structure 100 is as an electrical fuse (eFuse). Fusible structure 100 includes a metal line 102, which in some embodiments is a narrow stripe (also called a "link") of conductive material (metal, polysilicon, or the like). To program a fusible structure 100, a programming current is applied to metal line 102 that destructively alters (i.e., fuses) metal line 102, thus increasing the resistance of fusible structure 100. In some embodiments, programming fusible structure 100 is referred to as burning fusible structure 100. In some embodiments, fusible structure 100 is used as a one-time programmable memory (OTP). In some embodiments, to determine the bit state stored by fusible structure 100, a sense current is propagated through metal line 102. A sense amplifier (not shown), which is electrically coupled to metal line 102, compares the current on metal line 102 with a reference current. The sense current is lower in magnitude than the programming current and thus does not destructively alter metal line 102. The programming current is higher in magnitude than the sense current. As such, a programming voltage that corresponds to the programming current is higher in magnitude than the sense voltage that corresponds to the sense current.

The programming voltage is configured to generate sufficient programming current so as to destructively alter metal line 102 with a result being the destructive alteration of metal line 102. The destructive alteration of metal line 102 breaks metal line 102 which creates an electrical discontinuity (or open circuit) in metal line 102. When metal line 102 is destructively altered and broken, metal line 102 is configured in a high resistance state. Prior to the destructive alteration of metal line 102, as shown in FIG. 1A, metal line 102 is in a low resistive state. As explained in further detail below, the configuration of fusible structure 100 shown in FIG. 1A facilitates using lower programming voltages, and thus lower programming currents, to destructively alter metal line 102 with (again) the result that metal line 102 is put into the high resistance state. In other words, the programming voltage is expanded into lower voltages thereby decreasing the probability that metal line 102 does not break. Increasing the range of the programming voltage range to include lower voltages is beneficial, e.g., because the voltages used by modern semiconductor devices are decreasing.

In some embodiments, the high resistance state or the low resistance state of fuse structure 100 are used to represent bit values, and thus data is stored in a non-volatile manner. Sense amplifiers (not shown) in a memory circuit (not shown) are configured to generate a read current of sufficiently small magnitude that does not alter metal line 102, and the corresponding resistance state (either the high resistance state or the low resistance state) of corresponding fusible structure 100 is determined by the sense amplifier (not shown). In a write operation (also referred to as a "programming operation"), a source line driver (not shown) is configured to supply a write voltage (also referred to as "programming voltage") to metal line 102 to destructively alter metal line 102. Other types of functionality other than as non-volatile memory are within the scopes of various embodiments.

Fusible structure 100 is provided in a semiconductor structure 104. Semiconductor structure 104 includes a semiconductor substrate 106 and one or more metal layers 108 formed above or below semiconductor substrate 104. In this embodiment, all of the components of fusible structure 100 are formed in a single metal layer 108. In other embodiments, one or more of the components of fusible structure 100 are formed in one metal layer and another one or more of the components of fusible structure 100 are formed in another metal layer.

Metal line 102 has a long axis that extends in a first direction, which is parallel to the X-axis in FIG. 1A. Metal line 102 has a short axis that extends in a second direction, which is perpendicular to the X-axis. In this embodiment, the short axis is parallel with the Y-axis. Metal line 102 includes a first portion 110, a second portion 112, and a third portion 114. Relative to the X-axis, first portion 110 is between second portion 112 and third portion 114. Relative to a third direction perpendicular to each of the X-axis and Y-axis, e.g., parallel to the Z-axis (not shown in FIG. 1A), first portion 110 and third portion 114 have approximately a first thickness and second portion 112 has approximately a second thickness. Second portion 112 is between first portion 110 and third portion 114 relative to the X-axis (i.e., parallel to the X-axis). The second thickness is less than the first thickness. Relative to the X-axis, first portion 110 has a length (L_110) demarcated by demarcations fp1, fp2; in some embodiments, the length of first portion 110 is about L_110≈0.12 µm. Relative to the X-axis, second portion 112 has a length (L_112) demarcated by demarcations sp1, fp1; in some embodiments, the length of second portion 112 is about L_112≈0.666 µm. Relative to the X-axis, third portion 114 has a length (L_114) demarcated by demarcations fp2, sp2; in some embodiments, the length of third portion 114 is L_112≈0.666 µm. In some embodiments, L_112≈L_114. In some embodiments, L_110≈0.18*L_112. In some embodiments, L_112≈L_114. In some embodiments, L_110≈0.18*L_114. In some embodiments, a length between demarcations tv1 and fp1 is L_tv1_fp1≈0.14 µm. In some embodiments, a length between demarcations tv2 and fp2 is L_tv2_fp2≈0.14 µm. In some embodiments, L_tv1_fp1≈L_tv2_fp2. In some embodiments, L_110≈0.86*L_tv1_fp1. In some embodiments, L_110≈0.86*L_tv2_fp2.

Because first portion 110 is thinner than second portion 112 and third portion 114, first portion 110 breaks at lower current amplitudes and thus at lower voltage amplitudes than each of first portion 110 and third portion 114. Because first portion 110 is thinner and breaks at lower current amplitudes and thus at lower voltage amplitudes, the lower end of the voltage range for the programming voltage is increased beneficially.

Fusible structure 100 includes dummy structure 116 and dummy structure 118. Dummy structure 116 and dummy structure 118 are on opposite sides of metal line 102 with respect to the X-axis. Dummy structure 116 and dummy structure 118 are aligned with one another with respect to the X-axis. Dummy structure 116 is separated from metal line 102 by a distance D1 with respect to the Y-axis. Dummy structure 118 is separated from metal line 102 by a distance D2 with respect to the Y-axis. In this embodiment, distance D1 and distance D2 are equal. In other embodiments, distance D1 and distance D2 are different.

Dummy structure 116 and dummy structure 118 are designed to prevent the destruction of first portion 110 of metal line 102 from affecting nearby non-dummy structures or devices. In some circumstances, programming/burning/destroying the first portion 110 results in sputtering, which can damage nearby non-dummy structures and/or devices. Dummy structures 116 and 118 are located so as to absorb material sputtered from first portion 110, which reduces (if not prevents) damage to the nearby structures and/or devices.

Reducing distances D1, D2 facilitates the first thickness of first portion 110 being thinner in comparison with the remainder of metal line 102 (i.e., second portion 112, third portion 114). In some embodiments, distances D1, D2 are equal. In some embodiments, D1=D2=22 nanometers. In some embodiments, D1=D2=32 nanometers. In some embodiments, D1=D2=42 nanometers. In some embodiments, D1=D2=60 nanometers. In some embodiments, D1=D2=90 nanometers. In some embodiments, D1=D2=120 nanometers.

Dummy structure 116 and dummy structure 118 are of any shape. In FIG. 1A, dummy structure 116 and dummy structure 118 are rectangles and have the same proportions. A long axis of dummy structure 116 and a long axis of dummy structure 118 are each provided in the X-axis to define a length a. A short axis of dummy structure 116 and a short axis of the dummy structure 118 are each provided in the Y-axis to define a width b. In some embodiments, a ratio of the length a divided by width b is between approximately 0.01 and 100. In some embodiments, the ratio of the length a divided by distance D1 is between approximately 0.01 and 100. In some embodiments, the ratio of the length a divided by distance D2 is between approximately 0.01 and 100.

As shown in FIG. 1A, fusible structure 100 also includes conductive pads 120, 122, 124, 126. In some embodiments, conductive pads 120, 122, 124, 126 are connected to metal line 102 through conductors and vias in other conductive layers and via layers (not shown). In this manner, the programming voltage and the sense voltage are applied to metal line 102. A leftmost edge of conductive pad 120 and a leftmost edge of conductive pad 122 are aligned with a first end of metal line 102. The first end of metal line 102 and leftmost edge of conductive pads 120, 122 are demarcated by demarcation sp1. Conductive pads 120, 122 each have a long axis that extends in the X-axis until demarcation tv1. A rightmost edge of conductive pads 124 and a rightmost edge of conductive pad 126 are aligned with a second end of metal line 102. Second end of metal line 102 and rightmost edge of conductive pads 124, 126 are demarcated by demarcation sp2. Conductive pads 124, 126 each have a long axis that extends in the X-axis until demarcation tv2.

A length L of metal line 102 is defined between rightmost edge of conductive pads 120, 122 (demarcated by demarcation tv1) and leftmost edge of conductive pads 124, 126 (demarcated by demarcation tv2 relative to the X-axis. Thus, in FIG. 1A, length L is the length of metal line 102 from demarcation tv1 to demarcation tv2. In some embodiments, L≈0.4 μm.

Metal line 102 defines a short axis in the Y-axis which provides a width w of metal line 102. In some embodiments, the ratio of distance D1 divided by length L is between approximately 0.01 and 100. In some embodiments, the ratio of the length a divided by distance D2 is between approximately 0.01 and 100. In some embodiments, the ratio of the length L a divided by the width w is between approximately 4 and 100. In some embodiments, the ratios mentioned above provide adequate spacing so that the metal line 102 is thinner in the first portion 110.

In FIG. 1A, dummy structure 116 and dummy structure 118 are aligned with the first portion 110 with respect to the X-axis. However, relative to the X-axis, first portion 110 extends slightly past dummy structures 116 and 118, both to the left and to the right of dummy structures 116 and 118. Thus, in FIG. 1A, there is a distance relationship in which distance fp1-fp2 is greater than length a. In some of the embodiments, the distance relationship is facilitated using optical proximity correction (OPC).

Figure 1B:
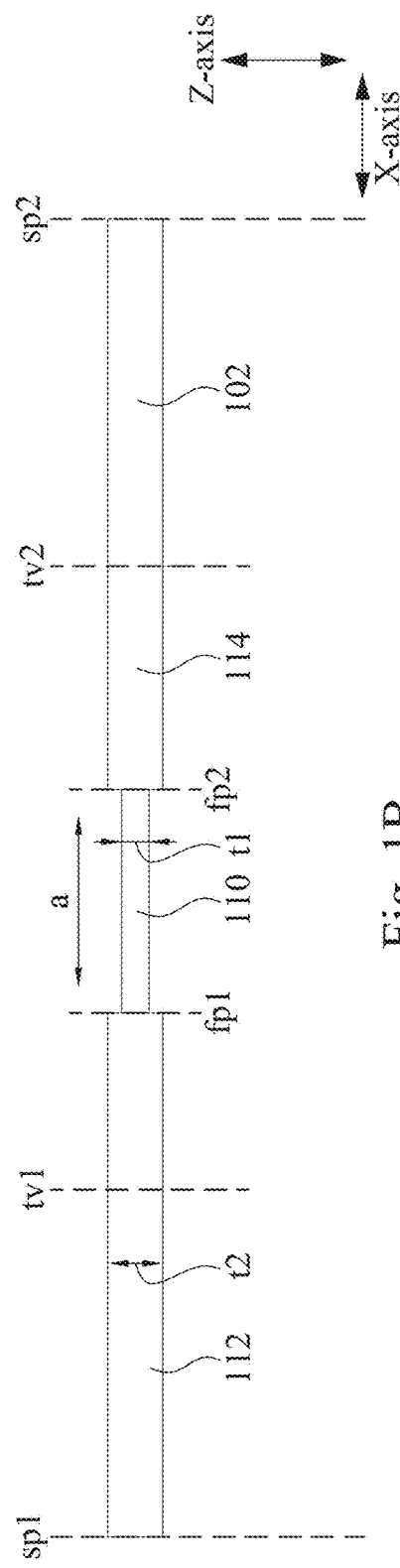
FIG. 1B is a component diagram that illustrates a cross-sectional view of the metal line 102 taken along a midline of the metal line in a first direction, in accordance with some embodiments.

FIG. 1B is a component diagram that illustrates a cross-sectional view of metal line 102 taken along a midline IB of metal line 102 in the X-axis, in accordance with some embodiments.

The thicknesses of metal line 102 is shown in FIG. 1B with respect to the Z-axis. The Y-axis is not shown in FIG. 1B because the Y-axis goes into and out of the page. As shown in FIG. 1B, metal line 102 has first portion 110 that is between second portion 112 and third portion 114 with respect to the X-axis. In this embodiment, second portion 112 and third portion 114 have a thickness t2 while first portion 110 has a thickness t1, where t2>t1. Second portion 112 and third portion 114 are thus thicker than first portion 110. Accordingly, first portion 110 is destructively altered at a lower programming voltage than second portion 112 and third portion 114 because first portion 110 is thinner than second portion 112 and third portion 114. More specifically, first portion 110 has less material and therefore is more susceptible to destruction from resistive heating than second portion 112 and third portion 114. In one embodiment, first portion 110 is destructively altered by an applied programming voltage of 1.53 Volts.

Dummy structure 116 (See FIG. 1A) and dummy structure 118 (See FIG. 1A) are placed near first portion 110. Because first portion 110 is designed to be destructively altered and dummy structures 116, 118 protect against metal sputtering, first portion 110 is thinner than second portion 112 and third portion 114. As shown in FIG. 1A, each of dummy structure 116 and dummy structure 118 is centered at first portion 110. However, length a of each of dummy structure 116 and dummy structure 118 is shorter than the length of first portion 110.

Figure 2:
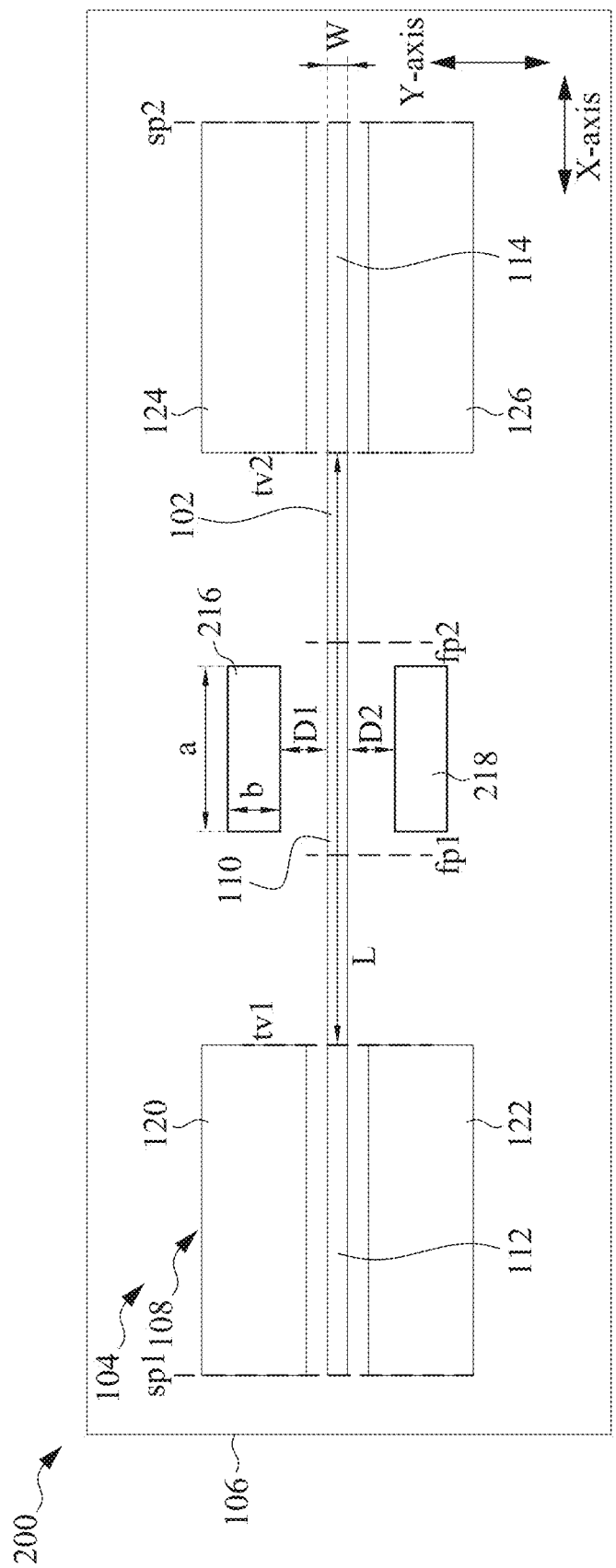
FIG. 2 is a component diagram of a fusible structure, in accordance with some embodiments.

FIG. 2 is a top view of a fusible structure 200, in accordance with some embodiments.

Fusible structure 200 is similar to fusible structure 100 in FIG. 1A. Accordingly, discussion of fusible structure 200 concentrates on the differences between fusible structure 200 and fusible structure 100. Like components include similar labels.

Dummy structure 216 and dummy structure 218 are sized in a similar manner as dummy structure 116 and dummy structure 118 in FIG. 1A. Additionally, dummy structure 216 and dummy structure 218 are positioned in the same manner as dummy structure 116 and dummy structure 118 with respect to the X-axis and the Y-axis. However, in this embodiment, dummy structure 216 and dummy structure 218 are in a different metal layer than metal line 112 and contact pads 120, 122, 124, 126. In this embodiment, dummy structure 216 and dummy structure 218 are in a second metal layer of metal layers 108 of semiconductor structure 104 while metal line 112 and contact pads 120, 122, 124, 126 are in a first metal layer of metal layers 108, the first metal layer being beneath the second metal layer.

In some embodiments, the memory circuit further includes programming devices. In some embodiments, multiple fuse elements are connected to each programming device. Thus, the multiple fuse elements share a same programming device which significantly reduces the area occupied by the memory circuit compared to other approaches. In some embodiments, the programming device includes at least one transistor that is sized to provide the programming voltage (and thereby the programming current) to the fusible structure 100 during a write operation. In some embodiments, the programming device is or is part of the source line driver.

Figure 3A:
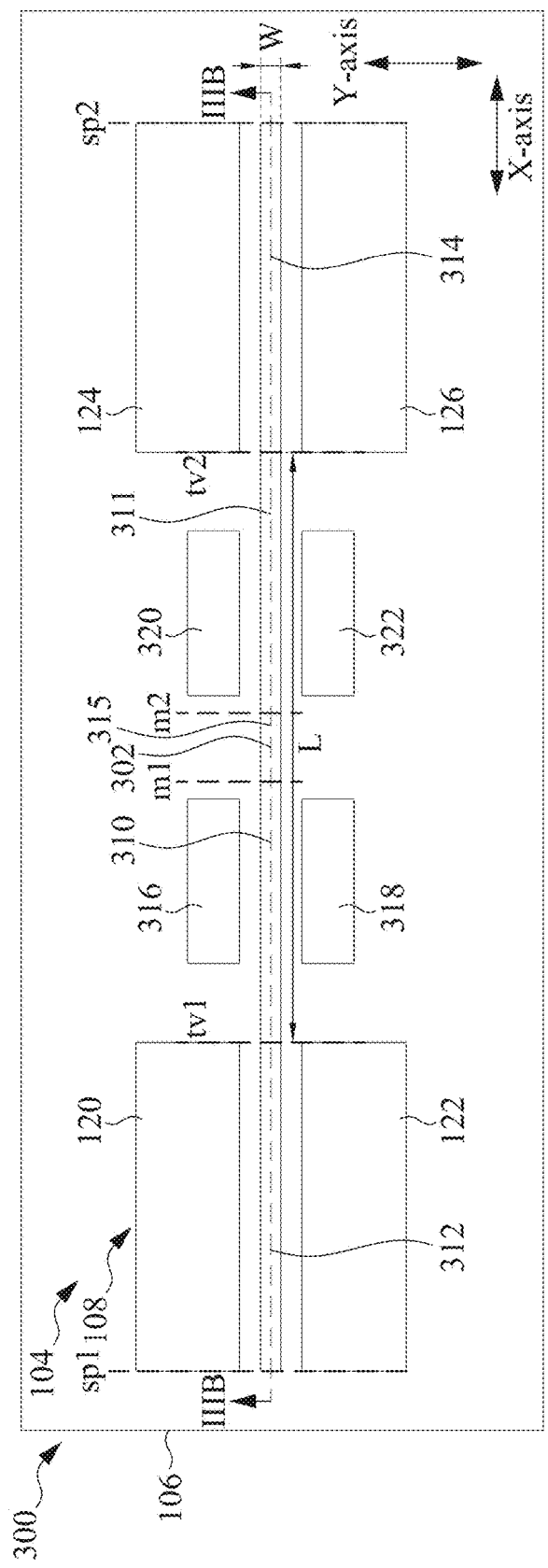
FIG. 3A is a component diagram of a fusible structure, in accordance with some embodiments.

FIG. 3A is a top view of a fusible structure 300, in accordance with some embodiments.

Fusible structure 300 is similar to fusible structure 100 in FIG. 1A. Accordingly, discussion of fusible structure 200 concentrates on the differences between fusible structure 200 and fusible structure 100. Like components include similar labels.

In this embodiment, fusible structure 300 includes a metal line 302 and dummy structures 316, 318, 320, and 322. Metal line 302 includes a first portion 310, a second portion 311, a third portion 312, a fourth portion 314, and a fifth portion 315. With respect to the X-axis, first portion 310 is between third portion 312 and fifth portion 315. First portion 310 is demarcated by demarcations tv1, m1. With respect to the X-axis, second portion 311 is between fifth portion 315 and fourth portion 314. Second portion 310 is demarcated by demarcations m2, tv2. With respect to the X-axis, third portion 312 is demarcated by demarcations sp1, tv1. Demarcation sp1 demarcates the left end of metal line 302 with respect to the X-axis. With respect to the X-axis, fourth portion 312 is demarcated by demarcations tv2, sp2. Demarcation sp2 demarcates the right end of metal line 302 with respect to the X-axis. With respect to the X-axis, fifth portion 315 is between first portion 310 and second portion 311. Fifth portion 315 is demarcated by demarcations m1, m2.

As explained in further detail below (See FIG. 3B), first portion 310 and second portion 311 are thinner than third portion 312, fourth portion 314, and fifth portion 315. More specifically, first portion 310 has less material and therefore is more susceptible to destruction from resistive heating than third portion 312, fourth portion 314, and fifth portion 315. Accordingly, first portion 310 and second portion 311 are destructively altered at lower programming voltages than third portion 312, fourth portion 314, and fifth portion 315. By destructively altering first portion 310 and/or second portion 311, fusible structure 300 goes from the low resistance state to the high resistance state.

Fusible structure 300 includes dummy structures 316, 318, 320, and 322. Dummy structure 316 and dummy structure 320 are on one side of metal line 302 with respect to the X-axis while dummy structure 318 and dummy structure 322 are on an opposite side of metal line 302 with respect to the X-axis. Dummy structure 316 and dummy structure 318 are aligned with first portion 310 with respect to X-axis. Dummy structure 316 and dummy structure 318 are placed close enough to first portion 310 to allow first portion 310 to be thinner than third portion 312 and fifth portion 315. As shown in FIG. 3A, there is a length relationship in which dummy structure 316 and dummy structure 318 each have a length that is shorter than a length with respect to the X-axis of first portion 310. In some embodiments, the length relationship is facilitated by optical proximity correction (OPC).

Dummy structure 318 and dummy structure 322 are aligned with second portion 311 with respect to X-axis. Dummy structure 318 and dummy structure 322 are placed close enough to second portion 311 to allow second portion 311 to be thinner than fifth portion 315 and fourth portion 314. More specifically, second portion 311 has less material and therefore is more susceptible to destruction from resistive heating than third portion 312, fourth portion 314, and fifth portion 315. As shown in FIG. 3A, there is a length relationship in which dummy structure 316 and dummy structure 318 each have a length that is shorter than a length with respect to the X-axis of first portion 310. In some embodiments, the length relationship is facilitated by OPC.

Dummy structure 316 is separated from dummy structure 320 with respect to the X-axis and dummy structure 318 is separated from dummy structure 322 with respect to the X-axis. As a result, fifth portion 315 is located between first portion 310 and second portion 311 where fifth portion 315 is thicker than first portion 310 and second portion 311.

Figure 3B:
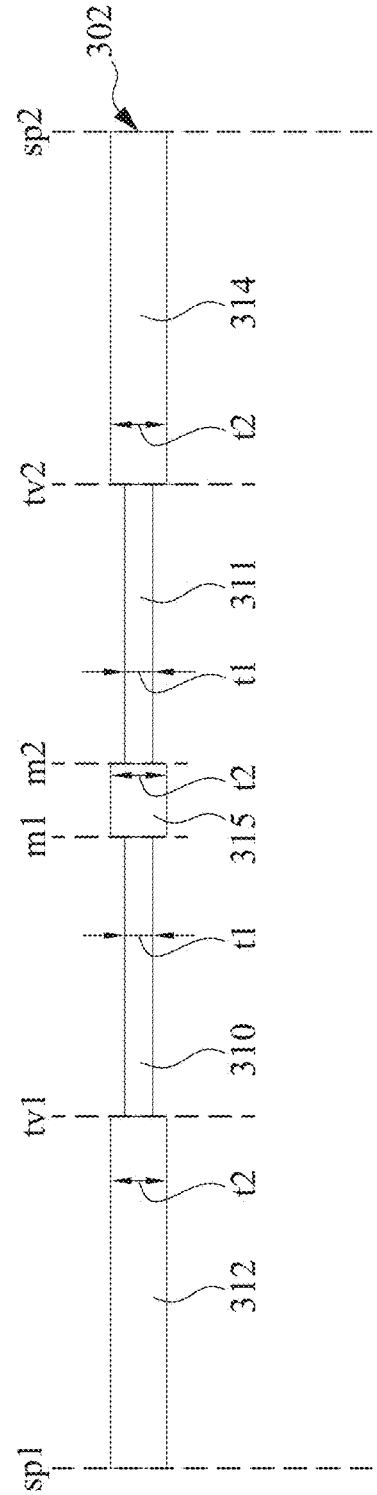
FIG. 3B is a component diagram that illustrates a cross-sectional view of the metal line taken along a midline of the metal line in a first direction, in accordance with some embodiments.

FIG. 3B is a component diagram that illustrates a cross-sectional view of metal line 302 taken along a midline IIIB of metal line 302 in the X-axis.

The thicknesses of metal line 302 is shown in FIG. 3B with respect to the Z-axis. The Y-axis is not shown in FIG. 3B because the Y-axis goes into and out of the page. As shown in FIG. 3B, metal line 302 has first portion 310 that is between third portion 312 and fifth portion 315 with respect to the X-axis. Metal line 302 also has second portion 311 between fifth portion 315 and fourth portion 314 with respect to the X-axis. In this embodiment, third portion 312, fourth portion 314 and fifth portion 315 have a thickness t2 while first portion 310 and second portion 311 have a thickness t1, where t2>t1. Third portion 312, fourth portion 314 and fifth portion 315 are thus thicker than first portion 310 and second portion 311. Accordingly, first portion 310 and second portion 311 are destructively altered at a lower programming voltage than third portion 312, fourth portion 314 and fifth portion 315. In one embodiment, first portion 310 and second portion 311 are destructively altered by an applied programming voltage of 1.53 Volts.

FIG. 4A is a top view of a fusible structure 400, in accordance with some embodiments.

Fusible structure 400 is similar to fusible structure 100 in FIG. 1A. Accordingly, discussion of fusible structure 400 concentrates on the differences between fusible structure 400 and fusible structure 100. Like components include similar labels.

Metal line 402 includes a first portion 410, a second portion 412, and a third portion 414. Relative to a Z-axis, first portion 410 and third portion 414 have approximately a first thickness and second portion 412 has approximately a second thickness. Second portion 412 is between first portion 410 and third portion 414 relative to the X-axis (i.e., parallel to the X-axis). The second thickness is less than the first thickness. First portion 410 is demarcated by demarcations fp1', fp2'. Second portion 412 is demarcated by demarcations sp1, fp1'. Third portion 114 is demarcated by demarcations fp2', sp2. Because first portion 410 is thinner than second portion 412 and third portion 414, first portion 410 breaks at lower current amplitudes and thus at lower voltage amplitudes.

In comparison to first portion 110 shown in FIG. 1A, first portion 410 in FIG. 4A is larger in length with respect to the X-axis because fusible structure 400 includes dummy structures 416, 418, and 420. Dummy structure 416 and dummy structure 420 are on one side of metal line 402 and dummy structure 418 is on an opposite side of metal line 402 with respect to X-axis. Dummy structure 418 is aligned with first portion 418 with respect to the X-axis and is partially between and partially overlapping dummy structure 416 and dummy structure 420 with respect to the X-axis. Dummy structure 416 and dummy structure 420 are partially aligned with first portion 410 with respect to X-axis. However, dummy structure 416 extends to the left past demarcation fp1' and dummy structure 420 extends to the right past demarcation 420. Dummy structure 416 and dummy structure 420 thus allow first portion 410 to be longer than first portion 110 in FIG. 1A but does not extend the entirety of length of the leftmost edge of dummy structure 416 and rightmost edge of dummy structure 420 because fusible structure 400 is asymmetric with respect to dummy structures 416, 418, and 420.

FIG. 4B is a component diagram that illustrates a cross-sectional view of metal line 402 taken along a midline IVB of metal line 402 in the X-axis, in accordance with some embodiments.

The thicknesses of metal line 402 is shown in FIG. 4B with respect to the Z-axis. The Y-axis is not shown in FIG. 4B because the Y-axis goes into and out of the page. As shown in FIG. 4B, metal line 402 has first portion 410 that is between second portion 412 and third portion 414 with respect to the X-axis. In this embodiment, second portion 412 and third portion 414 have a thickness t2 while first portion 410 has a thickness t1, where t2>t1. Second portion 412 and third portion 414 are thus thicker than first portion 410. Accordingly, first portion 410 is destructively altered at a lower programming voltage than second portion 412 and third portion 414. In one embodiment, first portion 410 is destructively altered by an applied programming voltage of 1.53 Volts.

Figure 5:
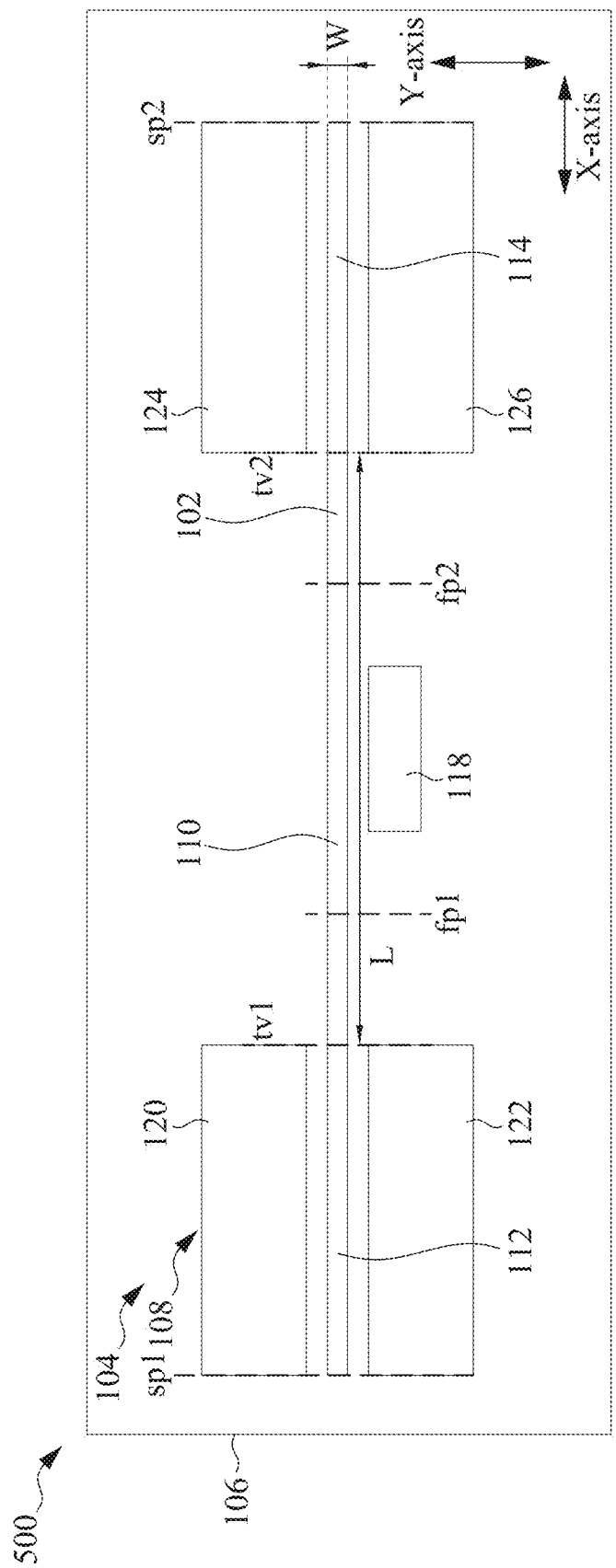
FIG. 5 is a component diagram of a fusible structure, in accordance with some embodiments.

FIG. 5 is a top view of a fusible structure 500, in accordance with some embodiments.

Fusible structure 500 is similar to fusible structure 100 in FIG. 1A. Accordingly, discussion of fusible structure 500 concentrates on the differences between fusible structure 500 and fusible structure 100. Like components include similar labels.

Fusible structure 500 is the same as fusible structure 100 except that fusible structure 500 does not include dummy structure 116. It should be noted that different embodiments of the fusible structure like fusible structures 100, 200, 300, 400, 500 include different numbers of dummy structures to provide different numbers of portions of different thicknesses, whether asymmetric or symmetric.

Figure 6:
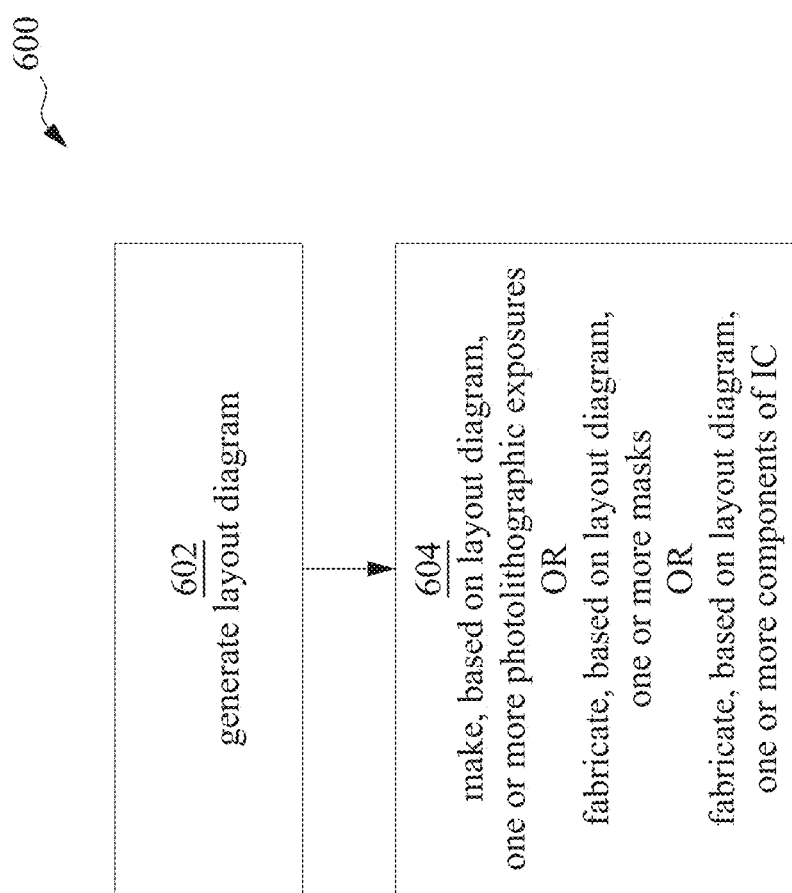
FIG. 6 is a flowchart of a method of generating a layout diagram, in accordance with some embodiments.

FIG. 6 is a flowchart of a method 600 of generating a layout diagram, in accordance with some embodiments.

Method 600 is implementable, for example, using EDA system 2 (FIG. 10, discussed above) and an integrated circuit (IC) manufacturing system 1100 (FIG. 11, discussed below), in accordance with some embodiments. Regarding method 600, examples of the layout diagram include layout diagrams having shapes that represent fusible structures 100, 200, 300, 400, 500, 800 and 900 in corresponding FIGS. 1A2, 3A, 4A, 5, 8A and 9A.

In FIG. 6, method 600 includes blocks 602-604. At block 602, a layout diagram is generated which, among other things, include shapes representing fusible structures 100, 200, 300, 400, 500, 800 and 900 in corresponding FIGS. 1A, 2, 3A, 4A, 5, 8A and 9A. From block 602, flow proceeds to block 604.

At block 604, based on the layout diagram, at least one of (A) one or more photolithographic exposures are made or (b) one or more semiconductor masks are fabricated or (C) one or more components in a layer of a semiconductor device are fabricated. See discussion below of IC manufacturing system 1100 in FIG. 11 below.

Figure 7:
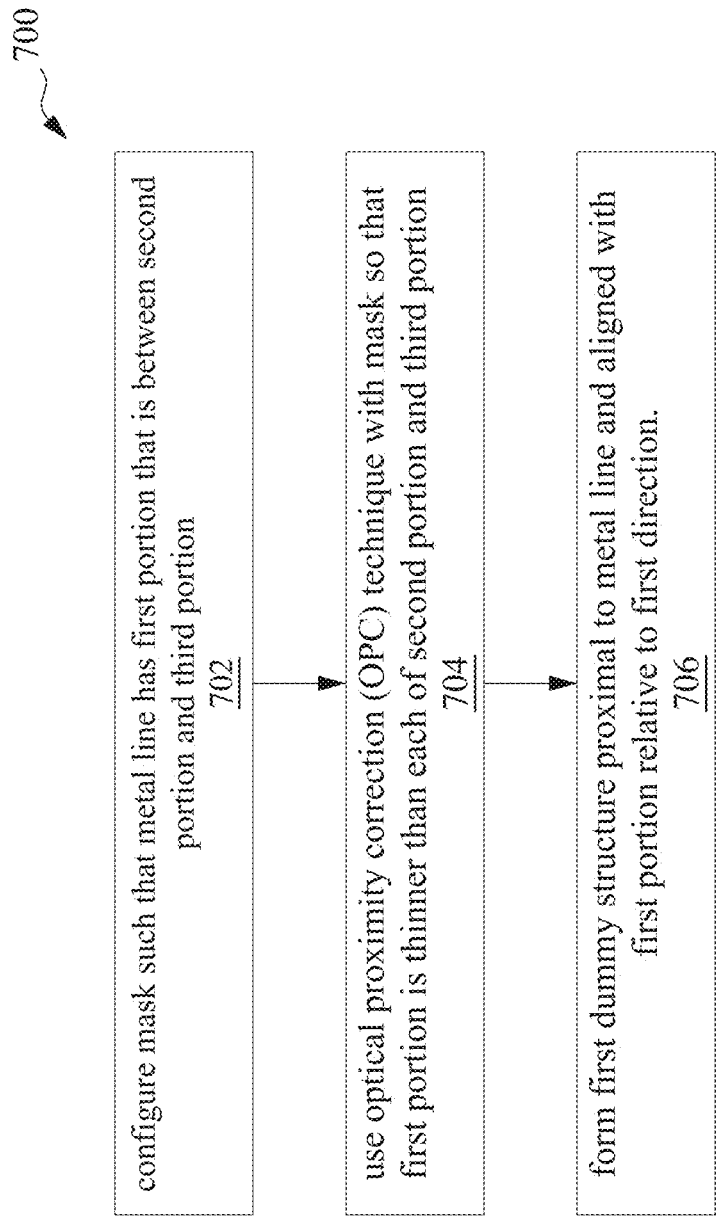
FIG. 7 is a flowchart of a method of forming a metal line, in accordance with some embodiments.

FIG. 7 is a flowchart 700 of a method of forming a metal line that extends in a X-axis, in accordance with some embodiments.

Examples of metal lines formed by flowchart 700 include metal line 102, metal line 302, and metal line 402, in corresponding FIGS. 1A, 3A and 4A. In some embodiments, the method is included in procedures performed during block 602 in order to fabricate a fusible structure, e.g., fusible structure 100, 200, 300, 400, 500, 800 and 900 in corresponding FIGS. 1A, 3A, 4A, 5, 8A and 9A. The method includes blocks 702-706.

At block 702, a mask is configured such that the metal line has a first portion that is between a second portion and a third portion. Examples of metal line are the metal line 102, 302, 402 in corresponding FIGS. 1A, 3A and 4A. Examples of masks are discussed below in FIG. 8B and FIG. 9B. From block 702, flow proceeds to block 704.

At block 704, an optical proximity correction (OPC) technique is used with the mask so that the first portion is thinner than each of the second portion and the third portion. Examples of first portion include first portion 110, first portion 310, second portion 311, and first portion 410 in FIGS. 1B, 3B and 4B. From block 704, flow proceeds to block 706.

At block 706, a first dummy structure is formed proximal to the metal line and aligned with the first portion relative to the X-axis. Examples of dummy structures include dummy structures 116, 118 in FIG. 1A and FIG. 5, dummy structures 216, 218 in FIG. 2A, dummy blocks structures 316, 318, 320, 322 in FIG. 3A, and dummy structures 416, 418, 420 in FIG. 4A.

Figure 8A:
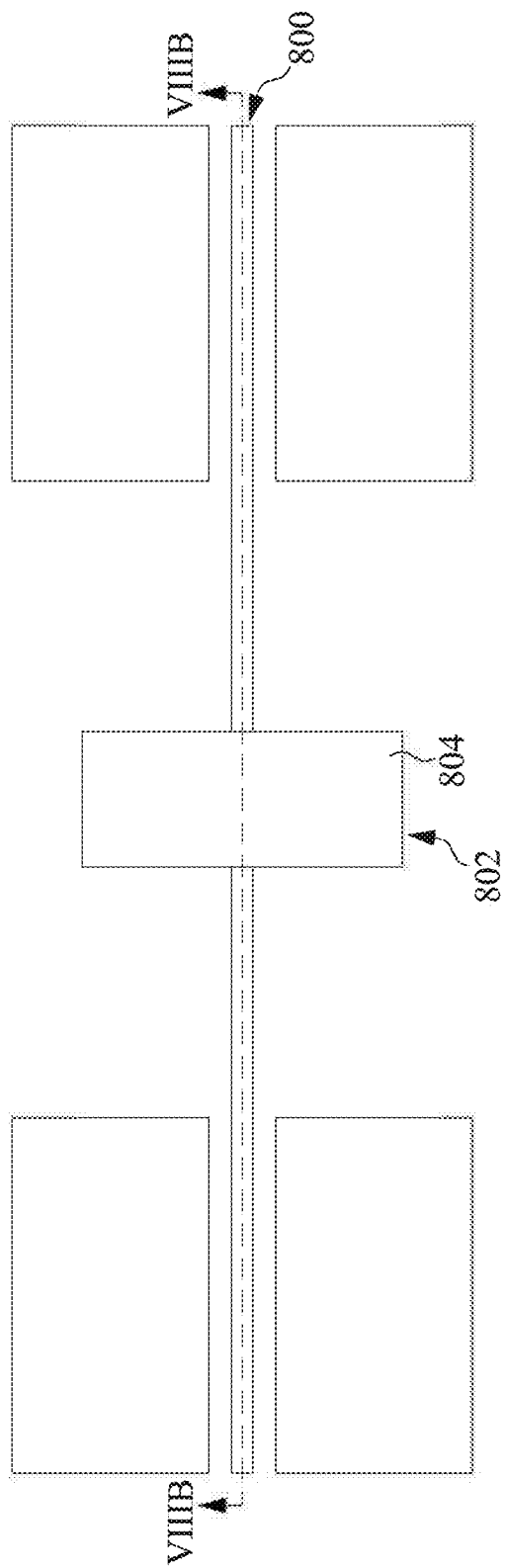
FIGS. 8A and 8B are correspondingly a component diagram and a cross-sectional view, in accordance with some embodiments.
Figure 8B:
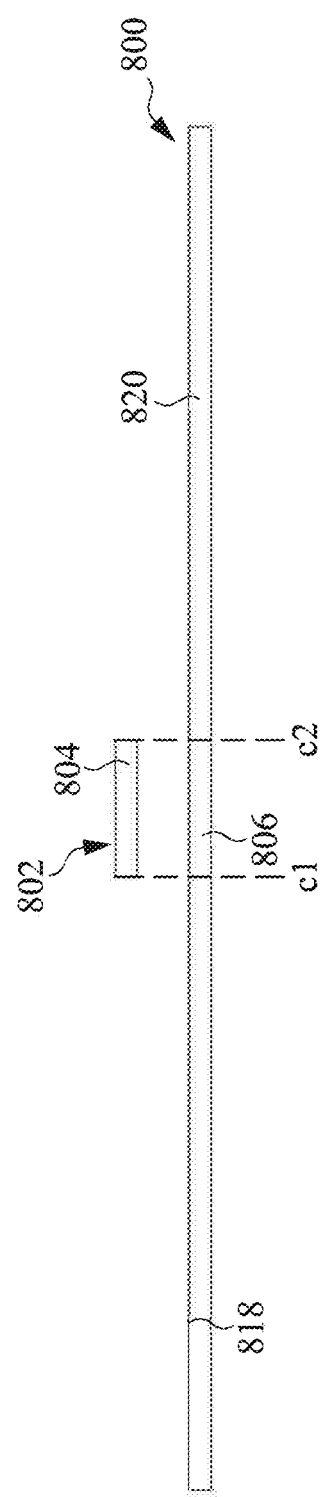

FIGS. 8A and 8B correspondingly a component diagram and a cross-sectional view, in accordance with some embodiments.

FIG. 8A is a top view while FIG. 8B is a cross sectional view along midline VIIIB of metal line 810. A corresponding mask 802 has a segment 804 over portion 806. Portion 806 is demarcated by demarcations C1, C2. An OPC technique is used with mask 802 so that portion 806 is thinner than each of portion 818 and third portion 820.

Figure 9A:
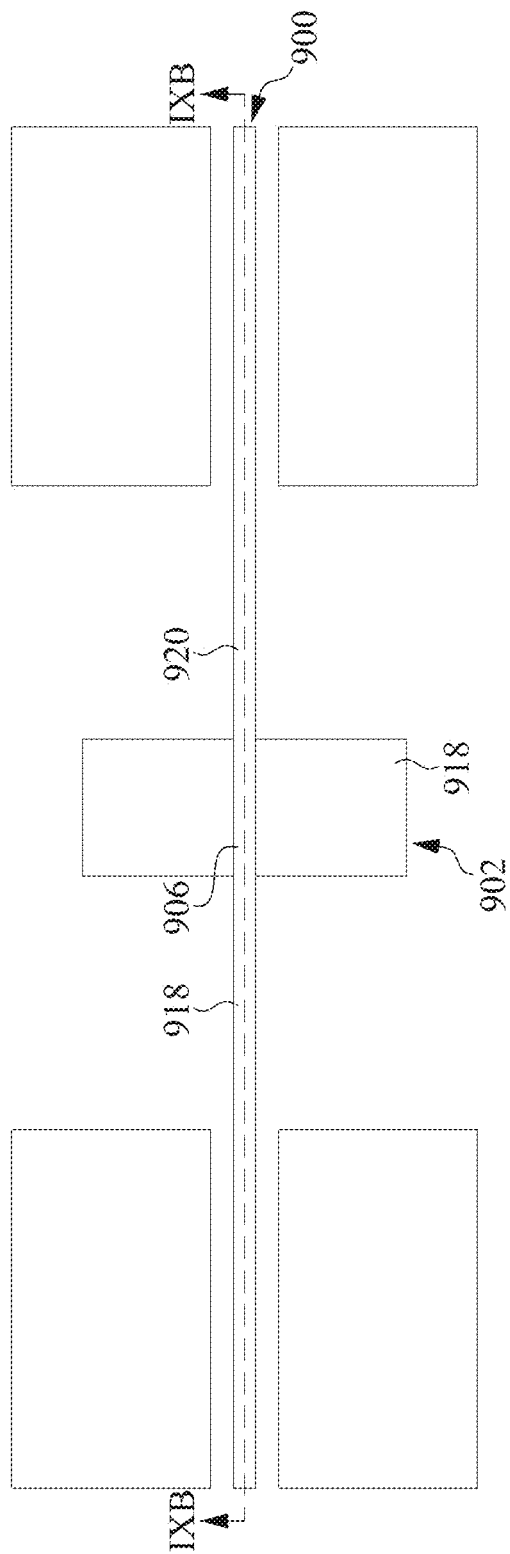
FIGS. 9A and 9B are correspondingly a component diagram and a cross-sectional view, in accordance with some embodiments.
Figure 9B:
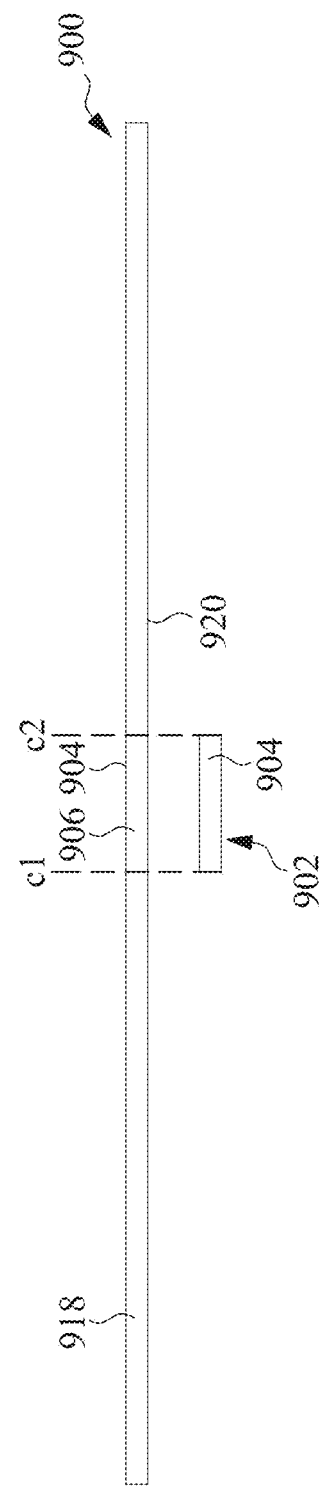

FIGS. 9A and 9B are correspondingly a component diagrams and a cross-sectional view, in accordance with some embodiments.

FIG. 9A is a top view while FIG. 9B is a cross sectional view along midline IXB of metal line 910. A corresponding mask 902 has a segment 904 under portion 906. Portion 906 is demarcated by demarcations C1, C2. An OPC technique is used with mask 902 so that portion 906 is thinner than each of portion 918 and third portion 920.

Figure 10:
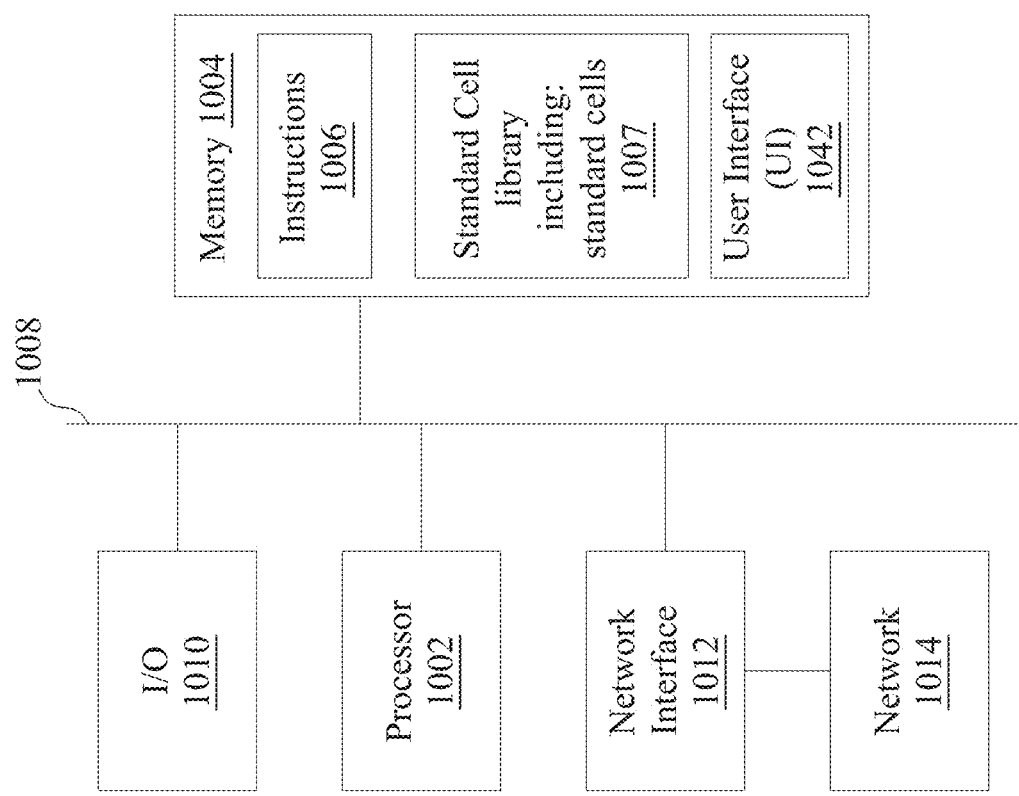
FIG. 10 is a block diagram of an electronic design automation (EDA) system, in accordance with some embodiments.

FIG. 10 is a block diagram of an electronic design automation (EDA) system 1000, in accordance with some embodiments.

In some embodiments, EDA system 1000 includes an APR system. Methods described herein of designing layout diagrams, in accordance with one or more embodiments, are implementable, for example, using EDA system 1000, in accordance with some embodiments.

In some embodiments, EDA system 1000 is a general purpose computing device including a hardware processor 1002 and a non-transitory, computer-readable storage medium 1004. Storage medium 1004, amongst other things, is encoded with, i.e., stores, computer program code 1006, i.e., a set of executable instructions. Execution of instructions 1006 by hardware processor 1002 represents (at least in part) an EDA tool which implements a portion or all of the methods described herein in accordance with one or more embodiments (hereinafter, the noted processes and/or methods).

Processor 1002 is electrically coupled to computer-readable storage medium 1004 via a bus 1008. Processor 1002 is also electrically coupled to an I/O interface 1010 by bus 1008. A network interface 1012 is also electrically connected to processor 1002 via bus 1008. Network interface 1012 is connected to a network 1014, so that processor 1002 and computer-readable storage medium 1004 are capable of connecting to external elements via network 1014. Processor 1002 is configured to execute computer program code 1006 encoded in computer-readable storage medium 1004 in order to cause system 1000 to be usable for performing a portion or all of the noted processes and/or methods. In one or more embodiments, processor 1002 is a central processing unit (CPU), a multi-processor, a distributed processing system, an application specific integrated circuit (ASIC), and/or a suitable processing unit.

In one or more embodiments, computer-readable storage medium 1004 is an electronic, magnetic, optical, electromagnetic, infrared, and/or a semiconductor system (or apparatus or device). For example, computer-readable storage medium 1004 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 1004 includes a compact disk-read only memory (CD-ROM), a compact disk-read/write (CD-R/W), and/or a digital video disc (DVD).

In one or more embodiments, storage medium 1004 stores computer program code 1006 configured to cause system 1000 (where such execution represents (at least in part) the EDA tool) to be usable for performing a portion or all of the noted processes and/or methods. In one or more embodiments, storage medium 1004 also stores information which facilitates performing a portion or all of the noted processes and/or methods. In one or more embodiments, storage medium 1004 stores library 1007 of standard cells including such standard cells as disclosed herein. In one or more embodiments, storage medium 1004 stores one or more layout diagrams 1009 corresponding to one or more layouts disclosed herein.

EDA system 1000 includes I/O interface 1010. I/O interface 1010 is coupled to external circuitry. In one or more embodiments, I/O interface 1010 includes a keyboard, keypad, mouse, trackball, trackpad, touchscreen, and/or cursor direction keys for communicating information and commands to processor 1002.

EDA system 1000 also includes network interface 1012 coupled to processor 1002. Network interface 1012 allows system 1000 to communicate with network 1014, to which one or more other computer systems are connected. Network interface 1012 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more systems 1000.

System 1000 is configured to receive information through I/O interface 1010. The information received through I/O interface 1010 includes one or more of instructions, data, design rules, libraries of standard cells, and/or other parameters for processing by processor 1002. The information is transferred to processor 1002 via bus 1008. EDA system 1000 is configured to receive information related to a UI through I/O interface 1010. The information is stored in computer-readable medium 1004 as user interface (UI) 1042.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by EDA system 1000. In some embodiments, a layout diagram which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 11:
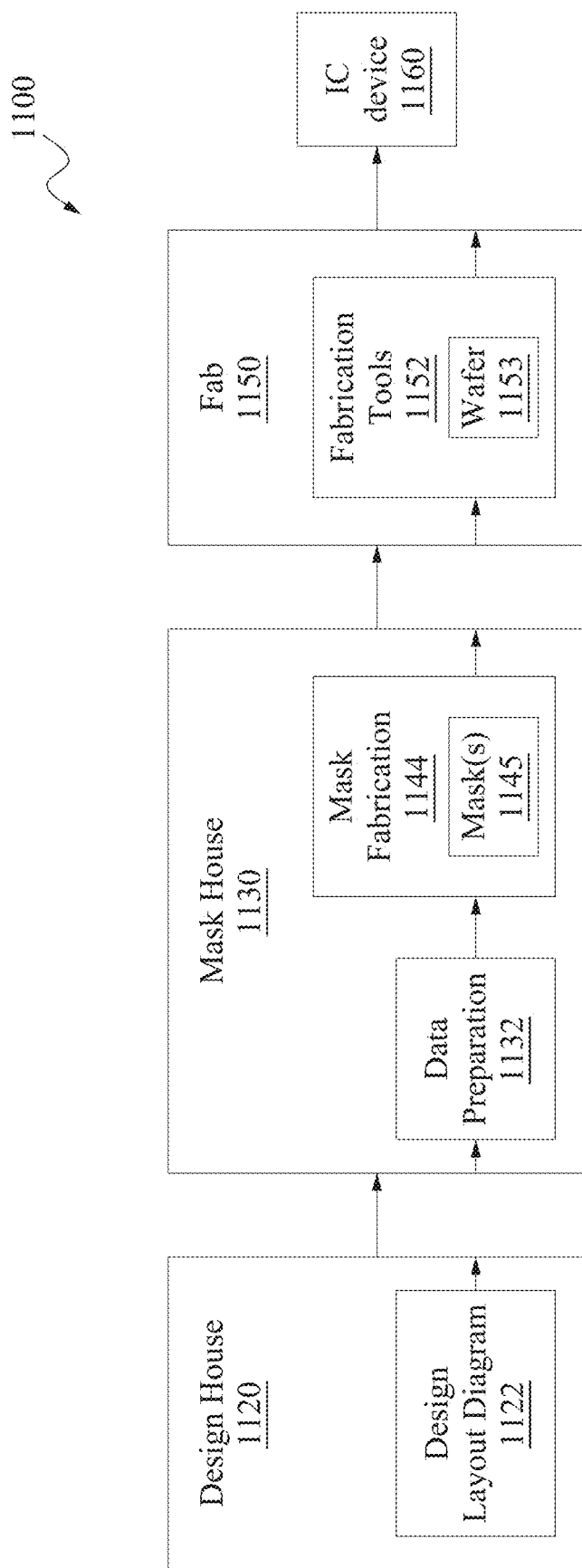
FIG. 11 is a block diagram of an integrated circuit (IC) manufacturing system, and an IC manufacturing flow associated therewith, in accordance with some embodiments.

FIG. 11 is a block diagram of an integrated circuit (IC) manufacturing system 1100, and an IC manufacturing flow associated therewith, in accordance with some embodiments.

The manufacturing system 1100 is configured to manufacture fusible structures 100, 200, 300, 400, 500, 800, 900 disclosed in corresponding FIGS. 1A-1B, 2, 3A-3B, 4A-4B, 5, 8A, 8B, 9A and 9B.

In some embodiments, based on a layout diagram, e.g., at least one of (A) one or more semiconductor masks or (B) at least one component in a layer of a semiconductor integrated circuit is fabricated using manufacturing system 1100.

In FIG. 11, IC manufacturing system 1100 includes entities, such as a design house 1120, a mask house 1130, and an IC manufacturer/fabricator ("fab") 1150, that interact with one another in the design, development, and manufacturing cycles and/or services related to manufacturing an IC device 1160. The entities in system 1100 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 1120, mask house 1130, and IC fab 1150 is owned by a single larger company. In some embodiments, two or more of design house 1120, mask house 1130, and IC fab 1150 coexist in a common facility and use common resources.

Design house (or design team) 1120 generates an IC design layout diagram 1122. IC design layout diagram 1122 includes various geometrical patterns designed for an IC device 1160. The geometrical patterns correspond to patterns of metal, oxide, or semiconductor layers that make up the various components of IC device 1160 to be fabricated. The various layers combine to form various IC features. For example, a portion of IC design layout diagram 1122 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 1120 implements a proper design procedure to form IC design layout diagram 1122. The design procedure includes one or more of logic design, physical design or place and route. IC design layout diagram 1122 is presented in one or more data files having information of the geometrical patterns. For example, IC design layout diagram 1122 is expressed in a GDSII file format or DFII file format.

Mask house 1130 includes data preparation 1132 and mask fabrication 1144. Mask house 1130 uses IC design layout diagram 1122 to manufacture one or more masks 1145 to be used for fabricating the various layers of IC device 1160 according to IC design layout diagram 1122. Mask house 1130 performs mask data preparation 1132, where IC design layout diagram 1122 is translated into a representative data file ("RDF"). Mask data preparation 1132 provides the RDF to mask fabrication 1144. Mask fabrication 1144 includes a mask writer. A mask writer converts the RDF to an image on a substrate, such as a mask (reticle) 1145 or a semiconductor wafer 1153. The design layout diagram 1122 is manipulated by mask data preparation 1132 to comply with particular characteristics of the mask writer and/or requirements of IC fab 1150. In FIG. 11, mask data preparation 1132 and mask fabrication 1144 are illustrated as separate elements. In some embodiments, mask data preparation 1132 and mask fabrication 1144 is collectively referred to as mask data preparation.

In some embodiments, mask data preparation 1132 includes optical proximity correction (OPC) which uses lithography enhancement techniques to compensate for image errors, such as those that can arise from diffraction, interference, other process effects and the like. OPC adjusts IC design layout diagram 1122. In some embodiments, mask data preparation 1132 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 1132 includes a mask rule checker (MRC) that checks the IC design layout diagram 1122 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 1122 to compensate for limitations during mask fabrication 1144, which may undo part of the modifications performed by OPC in order to meet mask creation rules.

In some embodiments, mask data preparation 1132 includes lithography process checking (LPC) that simulates processing that will be implemented by IC fab 1150 to fabricate IC device 1160. LPC simulates this processing based on IC design layout diagram 1122 to create a simulated manufactured device, such as IC device 1160. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus (DOF), mask error enhancement factor (MEEF), other suitable factors, and the like or combinations thereof. In some embodiments, after a simulated manufactured device has been created by LPC, if the simulated device is not close enough in shape to satisfy design rules, OPC and/or MRC are repeated to further refine IC design layout diagram 1122.

It should be understood that the above description of mask data preparation 1132 has been simplified for the purposes of clarity. In some embodiments, data preparation 1132 includes additional features such as a logic operation (LOP) to modify the IC design layout diagram 1122 according to manufacturing rules. Additionally, the processes applied to IC design layout diagram 1122 during data preparation 1132 may be executed in a variety of different orders.

After mask data preparation 1132 and during mask fabrication 1144, a mask 1145 or a group of masks 1145 are fabricated based on the modified IC design layout diagram 1122. In some embodiments, mask fabrication 1144 includes performing one or more lithographic exposures based on IC design layout diagram 1122. In some embodiments, an electron-beam (e-beam) or a mechanism of multiple e-beams is used to form a pattern on a mask (photomask or reticle) 1145 based on the modified IC design layout diagram 1122. Mask 1145 is formed in various technologies. In some embodiments, mask 1145 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask version of mask 1145 includes a transparent substrate (e.g., fused quartz) and an opaque material (e.g., chromium) coated in the opaque regions of the binary mask. In another example, mask 1145 is formed using a phase shift technology. In a phase shift mask (PSM) version of mask 1145, various features in the pattern formed on the phase shift mask are configured to have proper phase difference to enhance the resolution and imaging quality. In various examples, the phase shift mask is attenuated PSM or alternating PSM. The mask(s) generated by mask fabrication 1144 is used in a variety of processes. For example, such a mask(s) is used in an ion implantation process to form various doped regions in semiconductor wafer 1153, in an etching process to form various etching regions in semiconductor wafer 1153, and/or in other suitable processes.

IC fab 1150 is an IC fabrication business that includes one or more manufacturing facilities for the fabrication of a variety of different IC products. In some embodiments, IC Fab 1150 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 1150 includes fabrication tools 1152 configured to execute various manufacturing operations on semiconductor wafer 1153 such that IC device 1160 is fabricated in accordance with the mask(s), e.g., mask 1145. In various embodiments, fabrication tools 1152 include one or more of a wafer stepper, an ion implanter, a photoresist coater, a process chamber, e.g., a CVD chamber or LPCVD furnace, a CMP system, a plasma etch system, a wafer cleaning system, or other manufacturing equipment capable of performing one or more suitable manufacturing processes as discussed herein.

IC fab 1150 uses mask(s) 1145 fabricated by mask house 1130 to fabricate IC device 1160. Thus, IC fab 1150 at least indirectly uses IC design layout diagram 1122 to fabricate IC device 1160. In some embodiments, semiconductor wafer 1153 is fabricated by IC fab 1150 using mask(s) 1145 to form IC device 1160. In some embodiments, the IC fabrication includes performing one or more lithographic exposures based at least indirectly on IC design layout diagram 1122. Semiconductor wafer 1153 includes a silicon substrate or other proper substrate having material layers formed thereon. Semiconductor wafer 1153 further includes one or more of various doped regions, dielectric features, multi-level interconnects, and the like (formed at subsequent manufacturing steps).

Details regarding an integrated circuit (IC) manufacturing system (e.g., system 1100 of FIG. 11), and an IC manufacturing flow associated therewith are found, e.g., in U.S. Pat. No. 9,256,709, granted Feb. 9, 2016, U.S. Pre-Grant Publication No. 20150278429, published Oct. 1, 2015, U.S. Pre-Grant Publication No. 20140040838, published Feb. 6, 2014, and U.S. Pat. No. 7,260,442, granted Aug. 21, 2007, the entireties of each of which are hereby incorporated by reference.

In some embodiments, a fusible structure includes: a metal line in a first metal layer extending along a first direction; and a first dummy structure disposed proximal to the metal line relative to a second direction, the second direction being perpendicular to the first direction, the first dummy structure being in a second metal layer; and wherein: relative to the first direction, the metal line includes first, second and third portions, the second portion being between the first portion and third portion; and relative to a third direction that is perpendicular to the first direction and the second direction, the first portion has a first thickness and the second portion has a second thickness, the first thickness is greater than the second thickness.

In some embodiments, the first metal layer is beneath the second metal layer.

In some embodiments, relative to the first direction, a length of the second portion of the metal line is greater than a length of the first dummy structure.

In some embodiments, a width of the metal line is defined relative to the second direction; a distance is defined between the metal line and the first dummy structure relative to the second direction; and a ratio is defined as the distance divided by the width, wherein the ratio is in a range between approximately 0.1 and approximately 100.

In some embodiments, a first length of the first dummy structure is defined relative to the first direction; a second length of the first dummy structure is defined relative to the second direction; a ratio is defined as the second length divided by the first length; and the ratio is in a range between approximately 0.01 and approximately 100.

In some embodiments, a length of the first dummy structure is defined relative to the second direction; a distance is defined relative to the second direction between the metal line and the first dummy structure; a ratio is defined as the length divided by the distance; and the ratio is in a range between approximately 0.01 and approximately 100.

In some embodiments, a fusible structure includes: a metal line extending along a first direction; and dummy structures including first and second dummy structures disposed proximal to and symmetrically about the metal line relative to a second direction, the second direction being perpendicular to the first direction, the first dummy structure being in a metal layer; and wherein: relative to the first direction, the metal line includes first, second and third portions, the second portion being between the first portion and third portion; and relative to a third direction that is perpendicular to the first direction and the second direction, the first portion has a first thickness and the second portion has a second thickness, the first thickness is greater than the second thickness.

In some embodiments, a total number of the dummy structures is an even number.

In some embodiments, the dummy structures including the first and second dummy structures are disposed proximal to and symmetrically about the metal line relative to the first direction.

In some embodiments, a total number of the dummy structures is an odd number.

In some embodiments, the dummy structures including the first and second dummy structures are disposed proximal to and asymmetrically about the metal line relative to the first direction.

In some embodiments, relative to the first direction, a length of the second portion of the metal line is greater than a length of the first dummy structure.

In some embodiments, the metal layer in which the first dummy structure is located is a first metal layer; the metal line is in a second metal layer; and the second metal layer is different than the first metal layer.

In some embodiments, a fusible structure includes: a metal line in a first metal layer extending along a first direction; and a first dummy structure disposed proximal to the metal line relative to a second direction, the second direction being perpendicular to the first direction, the first dummy structure being in the first metal layer; and wherein: relative to the first direction, the metal line includes first, second and third portions, the second portion being between the first portion and third portion; and relative to a third direction that is perpendicular to the first direction and the second direction, the first portion has a first thickness and the second portion has a second thickness, the first thickness is greater than the second thickness.

In some embodiments, the fusible structure further includes: a second dummy structure; disposed proximal to the metal line relative to the second direction, the second dummy structure being in the first metal layer; and wherein: a total number of the dummy structures is an even number.

In some embodiments, the dummy structures including the first and second dummy structures are disposed proximal to and symmetrically about the metal line relative to the first direction or the second direction.

In some embodiments, a second dummy structure; disposed proximal to the metal line relative to the second direction, the second dummy structure being in the first metal layer; and wherein a total number of the dummy structures is an odd number.

In some embodiments, the dummy structures including the first and second dummy structures are disposed proximal to and asymmetrically about the metal line relative to the first direction.

In some embodiments, the dummy structures including the first and second dummy structures are disposed proximal to and symmetrically about the metal line relative to the first direction.

In some embodiments, relative to the first direction, a length of the second portion of the metal line is greater than a length of the first dummy structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A fusible structure comprising:
 a metal line in a first metal layer extending along a first direction; and
 a first dummy structure disposed proximal to the metal line relative to a second direction, the second direction being perpendicular to the first direction, the first dummy structure being in a second metal layer; and
 wherein:
  relative to the first direction, the metal line includes first, second and third portions, the second portion being between the first portion and the third portion; and
  relative to a third direction that is perpendicular to the first direction and the second direction, the first portion has a first thickness and the second portion has a second thickness, the first thickness being greater than the second thickness.

2. The fusible structure of claim 1, wherein:
 the first metal layer is beneath the second metal layer.

3. The fusible structure of claim 1, wherein:
relative to the first direction, a length of the second portion of the metal line is greater than a length of the first dummy structure.

4. The fusible structure of claim 1, wherein:
a width of the metal line is defined relative to the second direction;
a distance is defined between the metal line and the first dummy structure relative to the second direction; and
a ratio is defined as the distance divided by the width, wherein the ratio is in a range between approximately 0.1 and approximately 100.

5. The fusible structure of claim 1, wherein:
a first length of the first dummy structure is defined relative to the first direction;
a second length of the first dummy structure is defined relative to the second direction;
a ratio is defined as the second length divided by the first length; and
the ratio is in a range between approximately 0.01 and approximately 100.

6. The fusible structure of claim 1, wherein:
a length of the first dummy structure is defined relative to the second direction;
a distance is defined relative to the second direction between the metal line and the first dummy structure;
a ratio is defined as the length divided by the distance; and
the ratio is in a range between approximately 0.01 and approximately 100.

7. A fusible structure comprising:
a metal line extending along a first direction; and
dummy structures including first and second dummy structures disposed proximal to and symmetrically about the metal line relative to a second direction, the second direction being perpendicular to the first direction, the first dummy structure being in a metal layer; and
wherein:
relative to the first direction, the metal line includes first, second and third portions, the second portion being between the first portion and the third portion; and
relative to a third direction that is perpendicular to the first direction and the second direction, the first portion has a first thickness and the second portion has a second thickness, the first thickness is greater than the second thickness.

8. The fusible structure of claim 7, wherein:
a total number of the dummy structures is an even number.

9. The fusible structure of claim 8, wherein:
the dummy structures including the first and second dummy structures are disposed proximal to and symmetrically about the metal line relative to the first direction.

10. The fusible structure of claim 7, wherein:
a total number of the dummy structures is an odd number.

11. The fusible structure of claim 10, wherein:
the dummy structures including the first and second dummy structures are disposed proximal to and asymmetrically about the metal line relative to the first direction.

12. The fusible structure of claim 7, wherein:
relative to the first direction, a length of the second portion of the metal line is greater than a length of the first dummy structure.

13. The fusible structure of claim 7, wherein:
the metal layer in which the first dummy structure is located is a first metal layer;
the metal line is in a second metal layer; and
the second metal layer is different than the first metal layer.

14. A fusible structure comprising:
a metal line in a first metal layer extending along a first direction; and
a first dummy structure disposed proximal to the metal line relative to a second direction, the second direction being perpendicular to the first direction, the first dummy structure being in the first metal layer; and
wherein:
relative to the first direction, the metal line includes first, second and third portions, the second portion being between the first portion and the third portion;
relative to a third direction that is perpendicular to the first direction and the second direction, the first portion has a first thickness and the second portion has a second thickness, the first thickness is greater than the second thickness.

15. The fusible structure of claim 14, further comprising:
a second dummy structure; disposed proximal to the metal line relative to the second direction, the second dummy structure being in the first metal layer; and
wherein:
a total number of the dummy structures is an even number.

16. The fusible structure of claim 15, wherein;
the dummy structures including the first and second dummy structures are disposed proximal to and symmetrically about the metal line relative to the first direction or the second direction.

17. The fusible structure of claim 14, further comprising:
a second dummy structure disposed proximal to the metal line relative to the second direction, the second dummy structure being in the first metal layer; and
wherein;
a total number of the dummy structures is an odd number.

18. The fusible structure of claim 17, wherein;
the dummy structures including the first and second dummy structures are disposed proximal to and asymmetrically about the metal line relative to the first direction.

19. The fusible structure of claim 18, wherein;
the dummy structures including the first and second dummy structures are disposed proximal to and symmetrically about the metal line relative to the first direction.

20. The fusible structure of claim 14, wherein:
relative to the first direction, a length of the second portion of the metal line is greater than a length of the first dummy structure.

* * * * *